United States Patent [19]
Hanawa et al.

[11] Patent Number: 5,328,560
[45] Date of Patent: Jul. 12, 1994

[54] METHOD OF MANUFACTURING SEMICONDUCTOR DEVICE

[75] Inventors: Tetsuro Hanawa; Maria Op de Beeck, both of Hyogo, Japan

[73] Assignee: Mitsubishi Denki Kabushiki Kaisha, Tokyo, Japan

[21] Appl. No.: 68,133

[22] Filed: May 27, 1993

[30] Foreign Application Priority Data

Jun. 9, 1992 [JP] Japan .................................. 4-149391

[51] Int. Cl.$^5$ .......................................... H01L 21/00
[52] U.S. Cl. ..................... 156/661.1; 156/659.1; 156/904; 430/313; 430/314; 430/323; 430/325; 437/225; 437/228; 437/229
[58] Field of Search .................. 156/659.1, 661.1, 904; 430/313, 314, 323, 325; 437/228, 225, 229

[56] References Cited

U.S. PATENT DOCUMENTS

| | | | |
|---|---|---|---|
| 4,529,685 | 7/1985 | Borodovsky | 430/313 X |
| 4,810,619 | 3/1989 | Pampalone et al. | 430/313 |
| 4,826,564 | 5/1989 | Desilets et al. | 156/904 X |
| 5,100,503 | 3/1992 | Allman et al. | 156/661.1 X |
| 5,126,289 | 6/1992 | Ziger | 437/229 X |
| 5,202,061 | 4/1993 | Angelopoulos et al. | 252/500 |

OTHER PUBLICATIONS

"Use of Thin Films of Conjugated Organic Macrocycles as the Active Elements in Toxic-Gas Sensors Operating at Room Temperature", Honeybourne et al., J. Chem. Soc., Faraday Trans. 1, 1984, 80, pp. 851–863.

*Primary Examiner*—Thi Dang
*Attorney, Agent, or Firm*—Lowe, Price, LeBlanc & Becker

[57] ABSTRACT

A method of manufacturing semiconductor devices is provided which is improved so as to form a resist pattern even in a substrate having a step thereon with well controlled dimensional precision, and carry out etching of an underlying substrate with well controlled dimensional precision. An underlying film of an organic substance having the properties of sublimation, photo absorption and insolubility in an organic solvent is formed on a semiconductor substrate. A resist is applied onto the underlying film. Light is selectively irradiated on the resist. The resist is developed to form a resist pattern. The semiconductor substrate is etched with the resist pattern used as a mask.

15 Claims, 13 Drawing Sheets

FIG. 10
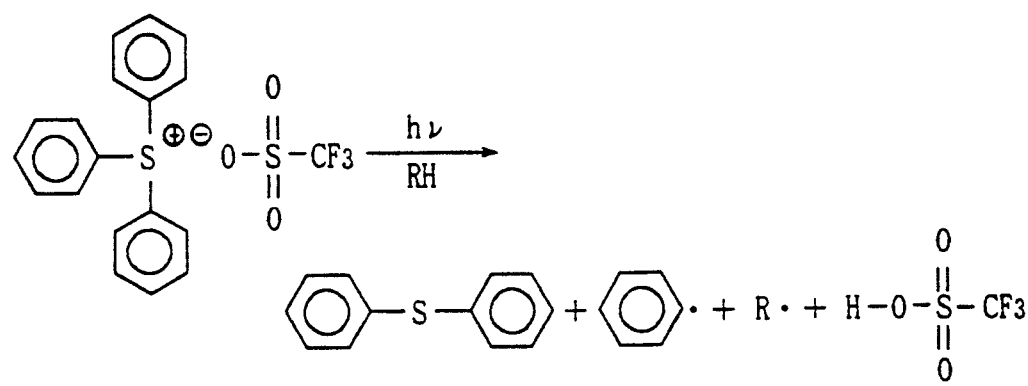
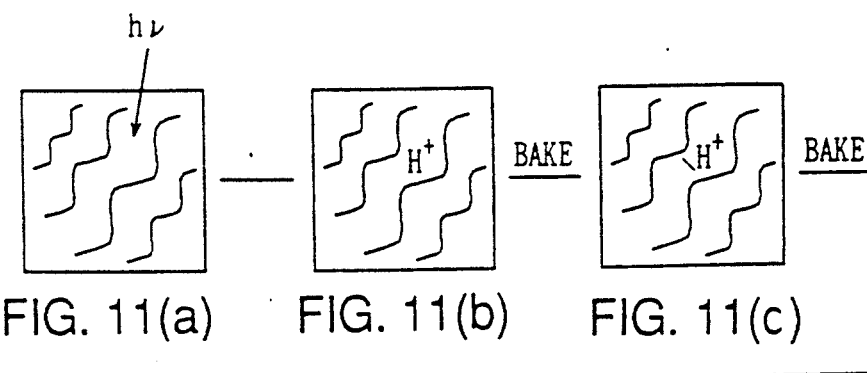
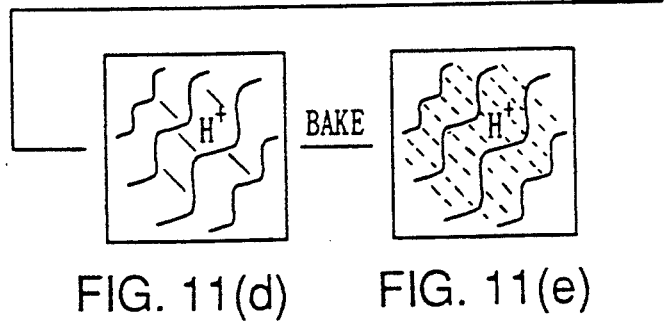
FIG. 11(a)  FIG. 11(b)  FIG. 11(c)
FIG. 11(d)  FIG. 11(e)

METHOD OF MANUFACTURING SEMICONDUCTOR DEVICE

BACKGROUND OF THE INVENTION

Field of the Invention

The present invention generally relates to a method of manufacturing semiconductor devices, and more particularly, to a method of manufacturing semiconductor devices including an improved process of forming a resist pattern with good dimensional reproduction precision. The present invention also relates to a method of manufacturing semiconductor devices including an improved process of suppressing resist from being charged when patterning is effected on the resist with an electron beam. The present invention further relates to a method of manufacturing semiconductor devices including an improved process of suppressing the resist from being charged when ions are implanted with the resist pattern used as a mask.

Description of the Background Art

In a process of manufacturing 64M dynamic random access memories and other devices developed thereafter, it is necessary to develop a quarter micron lithography technology. Currently, in a lithography using a deep UV ray of excimer laser light and the like, chemical amplification negative type resist is used including a base resin having small absorption with regard to the deep UV ray, an acid generating agent decomposed by a photochemical reaction for generating acid, and a crosslinking agent for crosslinking the base resin by an acid catalytic reaction.

FIGS. 8(a) to 8(c) show chemical structure formulas of components included in conventional chemical amplification negative type resist. The chemical amplification negative type resist includes a base resin of poly-p-hydroxystyrene shown in FIG. 8(a), a melamine crosslinking agent having two or more crosslinking points as shown in FIG. 8(b), and an acid generating agent shown in FIG. 8(c). In the figures, n denotes a natural number indicating the degree of polymerization, R denotes an alkyl group, M denotes a metal element of arsenic, antimony and the like, and X denotes a halogen element. n in Xn denotes a coordination number.

FIGS. 9(a) to 9(d) are partial cross-sectional views of a semiconductor device showing the steps in order of a conventional pattern formation method by an excimer laser lithography using the chemical amplification negative type resist.

Referring to FIG. 9(a), a chemical amplification negative type resist layer 8 for the excimer laser lithography of the film thickness of 1.0 to 1.5 $\mu$m is formed on a semiconductor substrate 2, the components of the resist being shown in FIGS. 8(a) to 8(c). The chemical amplification negative type resist layer 8 is formed by spin coating the resist solution on the semiconductor substrate 2 and soft-baking the same at about 90° to 130° C.

Referring to FIG. 9(b), excimer laser light 12 is selectively irradiated on the chemical amplification negative type resist layer 8 through a reticle 13. By the selective irradiation of the excimer laser light 12, as shown in the reaction formula of FIG. 10 triphenylsulfoniumtriflate serving as the acid generating agent is decomposed, and a protonic acid 9 which is trifluoromethanesulfonic acid is generated in an exposed portion 10 of the chemical amplification negative type resist layer 8.

Referring to FIG. 9(c), post-exposure baking was carried out for one to two minutes at the temperature of 110° to 140° C. Description will be given of the state of crosslinking by the baking in the exposed portion of the base resin with reference to FIGS. 11(a) to 11(e).

FIG. 11(a) shows the state of irradiation of, for example, the excimer laser light on the chemical amplification negative type resist layer 8. Referring to FIG. 11(b), when the excimer laser light is irradiated on the chemical amplification negative type resist layer 8, the triphenylsulfoniumtriflate is decomposed, and the protonic acid (H+) is generated. Referring to FIG. 11(c), when the resist is baked, one of the base resins is crosslinked by using the protonic acid (H+) as a catalyst and the protonic acid (H+) is formed as a by-product at this time. Referring to FIG. 11(d), the base resins are crosslinked one after another in a chain reaction by using the protonic acid (H+) formed as a by-product as the catalyst. Referring to FIG. 11(e), the base resins are crosslinked in a network structure by the above-described chain reaction. The crosslinking reaction is expressed by reaction formulas shown in FIGS. 12(a) to 12(c). In the reaction formulas, HX denotes the protonic acid (H+). The crosslinked portion becomes insoluble in alkali developer.

Returning to FIG. 9(c), a crosslinked portion 11 of the chemical amplification negative type resist layer 8 becomes insoluble in the alkali developer. Referring to FIG. 9(d), when the chemical amplification negative type resist layer 8 is developed by the alkali developer of an appropriate concentration, a non-exposed portion (non-crosslinked portion) is dissolved because of the developer, and a resist pattern 100 is formed on the semiconductor substrate 2. Then the semiconductor substrate 2 (for example, polysilicon) is etched with the resist pattern 100 used as a mask. As a result, the gate electrode and the like, for example, are formed.

According to the above-described conventional method of forming the resist pattern, a favorably small sized resist pattern which is rectangular in a cross-section is provided in high sensitivity on a flat semiconductor substrate.

However, since poly-p-hydroxystyrene serving as the base resin has high transparency to excimer laser light, it is strongly affected by effects of multiple reflection in film because of reflection of excimer laser light from an underlying semiconductor substrate.

As shown in FIG. 13, the effects of multiple reflection in film are produced by interference between irradiated light 17 and light reflected from the underlying semiconductor substrate 2. Referring to FIGS. 13 and 14, because of the effect of multiple reflection in film, the dimension of the resist pattern is considerably changed by variation of the film thickness of the resist 8. Therefore, referring to FIG. 13, in the case where the semiconductor substrate 2 has a step 2a, there is a problem that the dimension of the resist pattern does not become constant because of variation of the film thickness of the resist 8.

In order to prevent the effects of multiple reflection in film, an organic antireflective film is utilized in one method. The organic antireflective film can be obtained by, prior to coating the resist, applying novolak-naphthoquinone diazide type resist on the semiconductor substrate and by hard-baking the same. However, this method also has a problem described below.

Referring to FIG. 15(a), when novolak-naphthoquinone diazide type resist 30 is thinly applied to the semiconductor substrate 2 having the step 2a, a corner portion 21 of the step 2a is exposed for lack of affinity between the semiconductor substrate 2 and the novolak-naphthoquinone diazide type resist 30. If the novolak-naphthoquinone diazide type resist 30 is applied so as to cover the corner portion 21, referring to FIGS. 15(b) and 15(c), the film thickness of the resist 30 becomes relatively large at the bottom portion of the step 2a. When the height of the step 2a is, for example, 0.7 $\mu$m, the film thickness of the novolak-naphthoquinone diazide type resist 30 at the bottom portion of the step 2a becomes as large as 1.5 $\mu$m.

The antireflective film is completed by hard baking the novolak-naphthoquinone diazide type resist 30 thickly applied as described above. Then, referring to FIG. 15(d), a resist 101 for lithography is applied to the antireflective film (30) to be patterned. With the patterned resist 101 for lithography used as a mask, the semiconductor substrate 2 and the antireflective film (30) are simultaneously etched. At this time, there is little difference in etching speeds between the antireflective film (30) and the resist 101 for lithography. As a result, referring to FIG. 15(e), there is a problem that etching of the semiconductor substrate 2 is not carried out with well controlled dimensional precision.

In a lithography method using the conventional chemical amplification negative type resist, there was a problem described below also when patterning was effected with an electron beam.

Referring to FIG. 16(a), the chemical amplification negative type resist 8 is applied onto the semiconductor substrate 2. Then, the electron beam is selectively irradiated toward the chemical amplification negative type resist 8.

Referring to FIG. 16(b), when the electron beam is selectively irradiated on the chemical amplification negative type resist 8, since the resist 8 is an insulator, charging is generated on the surface of the resist 8 as shown in the figure.

As a result, referring to FIG. 16(c), when the resist 8 was developed, the taper-shaped resist pattern 101 was obtained, posing a problem that a resist pattern could not be formed with well controlled dimensional precision.

Furthermore, when the conventional chemical amplification negative type resist was used, there was a problem described below when ions were implanted with the resist used as a mask.

FIG. 17 is a diagram showing implantation of ions 52 to form a source/drain 51 on the main surface of a semiconductor substrate 50 with a pattern of the resist 30 used as a mask. When the ions are implanted, since the resist 30 is an insulator, charging is easily generated on the main surface of the resist 30. Therefore, as shown in the figure, there was a problem that a crack is produced in the resist 30 (the phenomenon of which is similar to a thunderbolt).

SUMMARY OF THE INVENTION

One object of the present invention is to provide a method of manufacturing semiconductor devices improved so as to form a resist pattern even on a substrate having a step and to carry out etching of an underlying substrate with well controlled dimensional precision.

Another object of the present invention is to provide a method of manufacturing semiconductor devices which is improved so as not to cause charging on the surface of the resist when patterning is effected with electron beams.

Still another object of the present invention is to provide a method of manufacturing semiconductor devices which is improved so as not to produce charging on the surface of the resist pattern when ions are implanted in the main surface of the semiconductor substrate with the resist pattern used as a mask.

In the method of manufacturing semiconductor devices according to one aspect of the present invention, an underlying film of organic substances having the properties of sublimation, photo absorption, and insolubility in an organic solvent is first provided on a semiconductor substrate. Resist is applied onto the underlying film. Light is selectively irradiated to the resist. A resist pattern is formed by developing the resist. The semiconductor substrate is etched with the resist pattern used as a mask.

The organic substances are preferably conjugated macrocyclic organic substances selected from the group consisting of a non-metal phthalocyanine derivative, a porphyrin derivative and a dihydro-dibenzo-tetraazacyclotetradecyne derivative.

In the method of manufacturing semiconductor devices according to another aspect of the present invention, the underlying film of organic substances having the properties of sublimation and insolubility in the organic solvent is provided on the semiconductor substrate. An oxidizing gas is doped in the underlying film to apply conductivity thereto. The resist is applied onto the underlying film. Patterning is effected on the resist with the electron beam. The resist is developed to form a resist pattern. The semiconductor substrate is etched with the resist pattern used as a mask.

In the present invention, the organic substances are preferably conjugated macrocyclic organic substances selected from the group consisting of a non-metal phthalocyanine derivative, a porphyrin derivative and a dihydro-dibenzo-tetraaza-cyclotetradecyne derivative.

The oxidizing gas is preferably gas selected from the group consisting of $NO_x$, hydrogen halogenide, halogen gas and $SO_x$.

In the method of manufacturing semiconductor devices according to still another aspect of the present invention, the underlying film of organic substances having the properties of sublimation and insolubility in the organic solvent is first provided on the semiconductor substrate. The oxidizing gas is doped in the underlying film, thereby applying conductivity thereto. The resist is applied onto the underlying film. The resist is patterned. Ions are implanted in the semiconductor substrate with the patterned resist used as a mask.

In the present invention, the organic substances preferably include conjugated macrocyclic organic substances selected from the group consisting of a non-metal phthalocyanine derivative, a porphyrin derivative and a dihydro-dibenzo-tetraaza-cyclotetradecyne derivative. The oxidizing gas is preferably gas selected from the group consisting of $NO_x$, hydrogen halogenide, halogen gas and $SO_x$.

In the method of manufacturing semiconductor devices according to one aspect of the present invention, the underlying film of organic substances having photo absorption is formed on the semiconductor substrate. Therefore, it is possible to reduce light reflected from the semiconductor substrate, which in turn can suppress variation of the dimension of the resist pattern caused by effects of multiple reflection in film.

Since the underlying film is formed of organic substances having the properties of sublimation, a method for sublimating the organic substances is adopted to form the underlying film, whereby the thickness of the underlying film is made uniform.

Since the underlying film is not dissolved in the organic solvent, it does not mix with resist to be applied next.

In the method of manufacturing semiconductor devices in accordance with another aspect of the present invention, the underlying film having conductivity applied is formed on the semiconductor substrate. Therefore, the resist is not charged when patterning is effected on the resist with electron beams.

In the method of manufacturing semiconductor devices according to still another aspect of the present invention, the underlying film having conductivity applied is formed on the semiconductor substrate. Therefore, the resist is not charged even though ions are implanted in the main surface of the semiconductor substrate with the resist pattern used as a mask.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a reaction formula showing the state of photo decomposition of an acid generating agent included in the chemical amplification negative type resist.

FIGS. 11(a) to 11(e) show the state of crosslinking in an exposed portion of the chemical amplification negative type resist.

DESCRIPTION OF THE PREFERRED EMBODIMENTS

Embodiments of the present invention will now be described with reference to the drawings.

FIGS. 1(a) to 1(f) are partial cross-sectional views of a semiconductor device showing the steps in order of manufacturing the same according to one embodiment of the present invention.

Figure 1A:
FIGS. 1(a) to 1(f) are partial cross-sectional views of a semiconductor device showing the steps in order of a method of manufacturing the same according to one embodiment of the present invention.

Referring to FIG. 1(a), an underlying film 7 of organic substances having the properties of sublimation, photo absorption, and insolubility in the organic solvent is formed on the semiconductor substrate 2 (for example, polysilicon).

FIGS. 2 (a) to 2 (c) show conjugated macrocyclic organic compounds which are examples of the organic substances forming the underlying film.

Figure 2A:
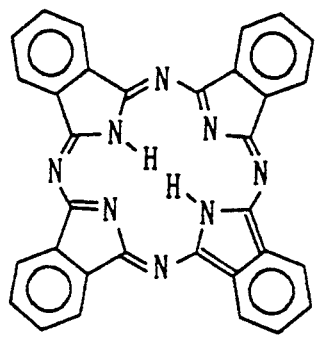
FIGS. 2(a) to 2(c) are illustrations showing specific examples of conjugated macrocyclic organic compounds used in the present invention.

FIG. 2(a) shows non-metallic phthalocyanine having strong absorption with regard to deep UV rays such as excimer laser light and the like, and insolubility in any organic solvents.

Figure 2B:
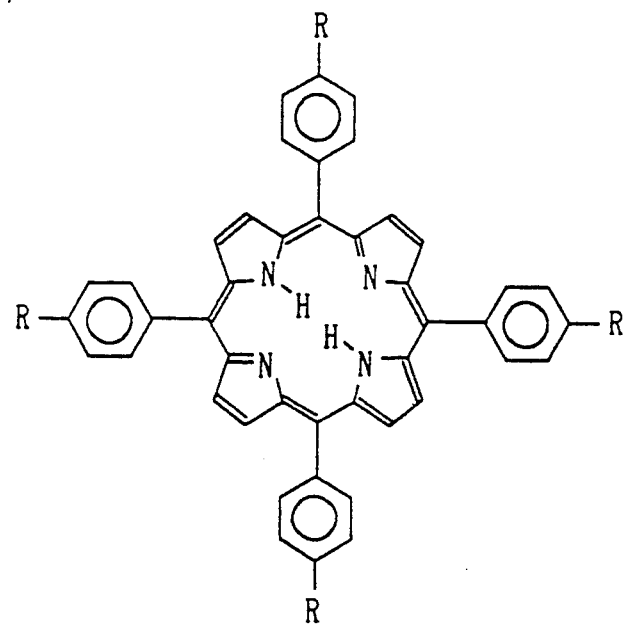

FIG. 2(b) shows meso-tetra (P-R-phenyl) porphyrin and derivatives having strong absorption with regard to deep UV rays such as excimer laser light and the like, sublimation, and insolubility in any organic solvents. In the figure, R denotes a hydrogen atom or an alkyl group.

Figure 2C:
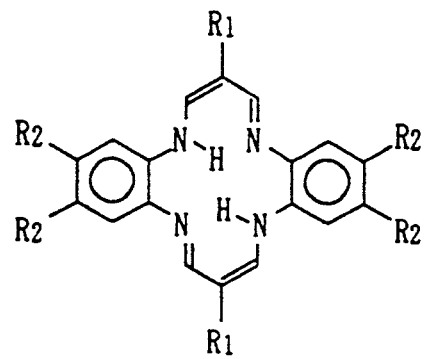

FIG. 2(c) shows dihydro-dibenzo [b, j][1. 4. 8. 11] tetraaza-cyclotetradecyne and derivatives thereof having strong absorption with regard to the deep UV rays such as the excimer laser light and the like, sublimation, and insolubility in any organic solvents. In the figure, $R_1$, $R_2$ denote a hydrogen atom or an alkyl group.

Figure 3:
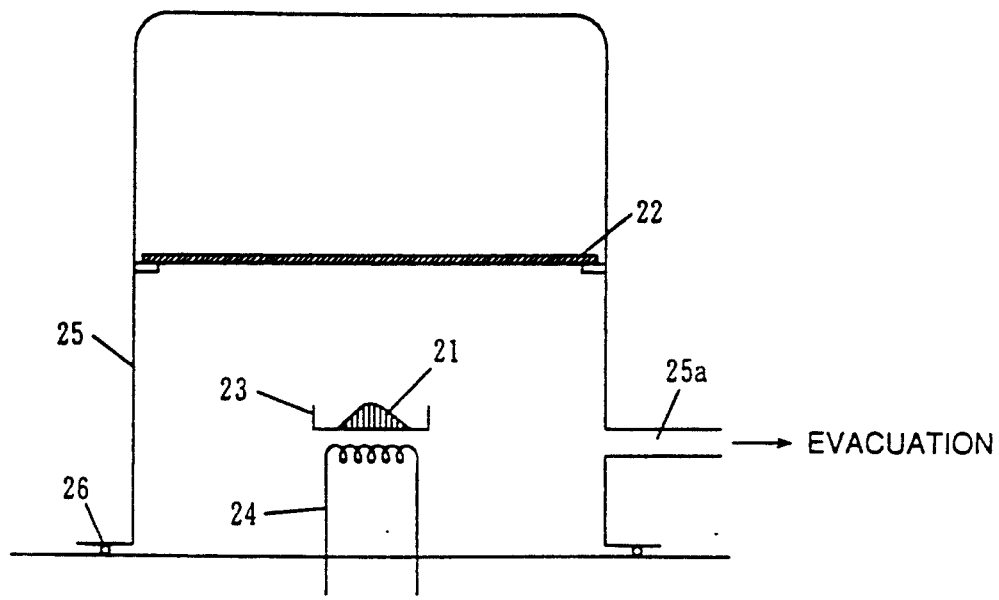
FIG. 3 is a schematic diagram showing a method of forming an underlying film of conjugated macrocyclic organic substances on a semiconductor substrate by a sublimation method.

FIG. 3 is a concept diagram showing a method of depositing by evaporation an underlying film on a semiconductor substrate by a sublimation method under reduced pressure by using conjugated macrocyclic organic substances shown in FIGS. 2(a) to 2(c). A device for forming the underlying film is provided with a belljar 25. The belljar 25 is fixed to the body portion (not shown) by a vacuum O-ring 26. A quartz board 23 carrying a conjugated macrocyclic organic compound 21 thereon is arranged in the belljar 25. A heater 24 is provided beneath the quartz board 23. A semiconductor substrate 22 is arranged above the belljar 25. The belljar 25 is provided with an exhaust vent 25a. The conjugated macrocyclic organic compound 21 is sublimated by heating to adhere onto the semiconductor substrate 22 as the underlying film. A thin film of a uniform thickness can be obtained when the film is formed by the sublimation method.

Sublimation is carried out under reduced pressure at the temperature of 100° to 300° C. The thickness of the underlying film is preferably 500 to 2000 Å.

Figure 1B:
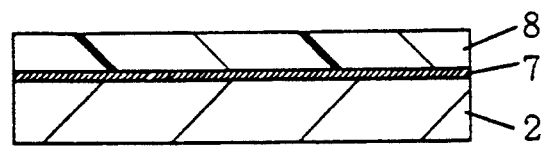

Referring to FIG. 1(b), the chemical amplification negative type resist layer 8 of the thickness of 1.0 to 1.5 $\mu$m is formed on the semiconductor substrate 2 having the underlying film 7 provided thereon. The chemical amplification negative type resist layer 8 is formed by spin-coating a resist solvent on the semiconductor substrate 2 and by soft-baking the resist at about 90° to 130° C. Since the underlying film formed of conjugated macrocyclic organic compounds is insoluble in any organic solvents, mixing between the resist layer 8 and the underlying film 7 does not occur.

Figure 1C:
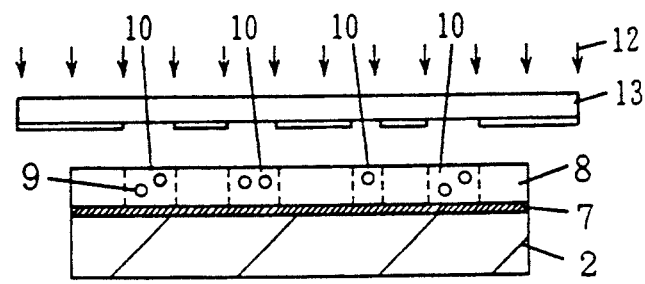

Referring to FIG. 1(c), deep UV rays such as excimer laser lights 12 and the like are selectively irradiated to the chemical amplification negative type resist layer 8 through the reticle 13. Because of the selective irradiation of the excimer laser lights 12, the protonic acid 9 is generated at the exposed portion 10 of the chemical amplification negative type resist layer 8. The protonic acid 9 promotes crosslinking reaction of the resin as shown in FIG. 11. Since the underlying film 7 absorbs the deep UV rays 12 of the excimer laser light and the like, effects of multiple reflection in film of the resist film are considerably reduced at the exposed portion 10.

Figure 1D:
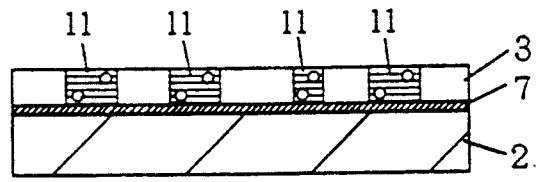

Referring to FIG. 1(d), after exposure, the resist is baked for one to two minutes at the temperature of 110° to 130° C. As shown in FIG. 11, the baking promotes crosslinking reaction of the base resin at the exposed portion 10 of the resist 8. Solubility of the crosslinked portion 11 to the alkali developer is decreased.

Figure 1E:
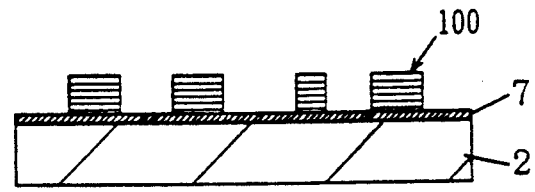

Referring to FIG. 1(e), developed by the alkali developer of an appropriate concentration, a non-exposed portion of the resist 8 dissolves in the alkali developer, causing a negative type pattern 100 to be formed.

Figure 1F:
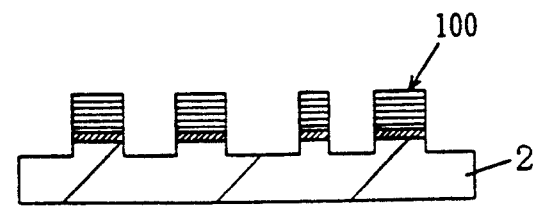

Referring to FIG. 1(f), the semiconductor substrate 2 and the underlying film 7 are simultaneously etched with the resist pattern 100 used as a mask. The underlying film 7 is easily etched away owing to its thinness.

In the method according to the embodiments, since the underlying film 7 is used, effects of multiple reflection in film are significantly reduced, which in turn makes it possible to carry out etching of the semiconductor substrate 2 with well controlled dimensional precision. As a result, for example, the gate electrode is reliably formed.

Figure 4:
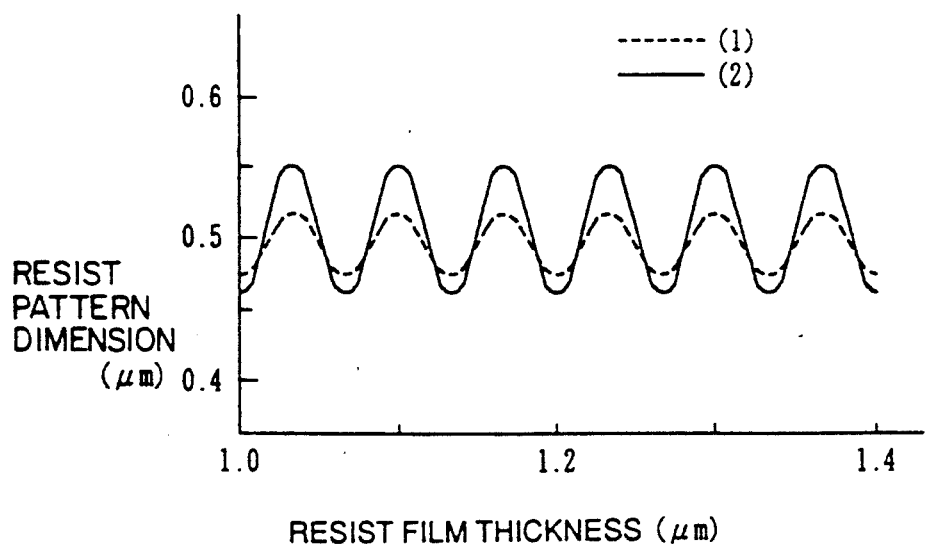
FIG. 4 is a representation for explaining effects of the present invention.

FIG. 4 is a representation showing dependency of the dimension of the resist pattern on the resist film thickness. A curve (1) shows data when the underlying film is used, while a curve (2) shows data when the underlying film is not formed. As is apparent from FIG. 4, if the underlying film of conjugated macrocyclic organic substances is formed on the surface of the semiconductor substrate prior to resist coating, effects of multiple reflection in film are significantly restrained.

FIGS. 5(a) to 5(d) are cross-sectional views of a semiconductor device showing the steps in order of manufacturing the same according to a second embodiment of the present invention.

Figure 5A:
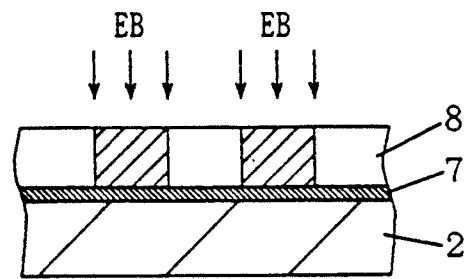
FIGS. 5(a) to 5(d) are partial cross-sectional views of a semiconductor device showing the steps in order of a method of manufacturing the same according to a second embodiment of the present invention.
Figure 6A:
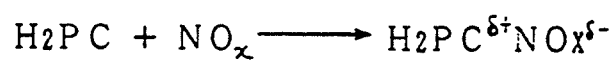
FIG. 6(a) shows a reaction formula when $NO_x$ serving as an oxidizing gas is doped to non-metallic phthalocyanine.

Referring to FIG. 5(a), the underlying film 7 of non-metal phthalocyanine (hereinafter referred to as H$_2$PC for short) is formed on the semiconductor substrate 2. NO$_x$ serving as an oxidizing gas is doped in the underlying film 7. Referring to the reaction formula shown in FIG. 6(a), electrons are partially withdrawn by NO$_x$ from non-metal phthalocyanine (H$_2$PC) having conjugated $\pi$ electrons. As a result, the non-metal phthalocyanine has a nature of the P type semiconductor, causing conductivity to appear.

Figure 6B:
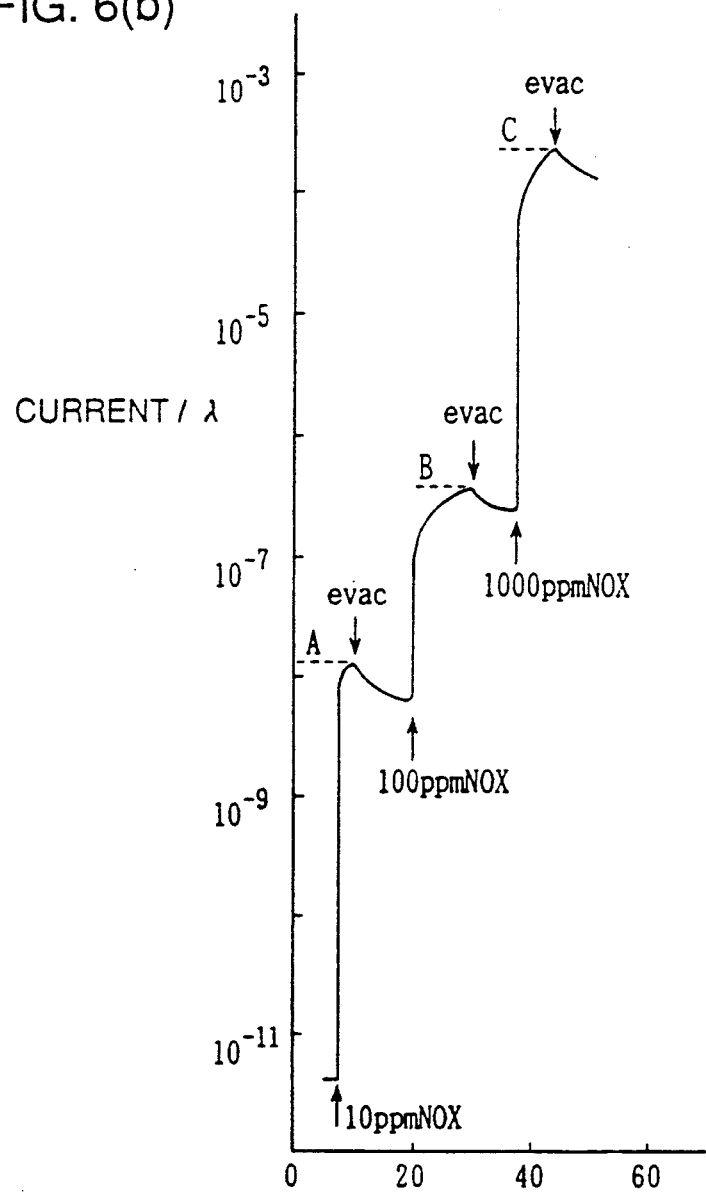
FIG. 6(b) shows effects of concentration of $NO_x$ on the conductivity of the non-metallic phthalocyanine.

FIG. 6(b) shows effects of concentration of NO$_x$ on the conductivity of the non-metal phthalocyanine (H$_2$PC). The data is described in *J. Chem. Soc. Faraday Trans.*, 1, 80, 851 (1984). As is apparent from FIG. 6(b), although NO$_x$ of 10 ppm to 1000 ppm is more preferably added to the underlying film, NO$_x$ in the range of 0.1 ppm to 100,000 ppm is preferably used.

Although the case where NO$_x$ is used as the oxidizing gas was described, the present invention is not limited thereto. Hydrogen halogenide, halogen gas and SO$_x$ may also be preferably used.

Returning to FIG. 5(a), electron beams are selectively irradiated to the resist 8.

Figure 5B:
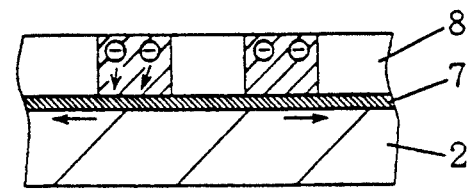

Referring to FIG. 5(b), even if electrical charge is produced in the surface of the resist 8 because of selective irradiation of the electron beams, the electrical charge escapes to the ground through the underlying film 7 having conductivity applied. As a result, charging is not produced in the surface of the resist 8.

Figure 5C:
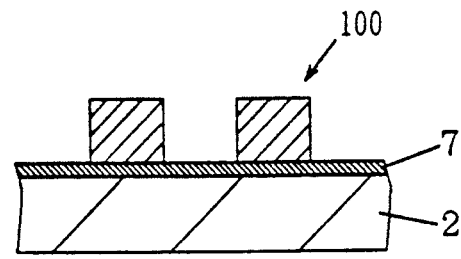

Referring to FIG. 5(c), when the resist 8 is developed, the resist pattern 100 of a favorable shape can be obtained.

Figure 5D:
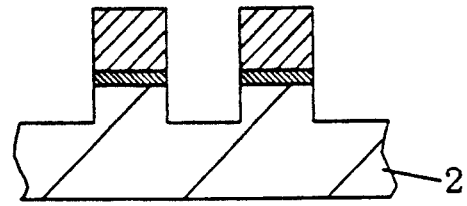

Referring to FIG. 5(d), with the resist pattern 100 used as a mask, the semiconductor substrate 2 and the underlying film 7 are simultaneously etched. The underlying film 7 can be easily etched away owing to its thinness. In this method, since charging takes place in the surface of the resist, the shape of the resist pattern 100 becomes favorable, which in turn makes it possible to carry out etching of the semiconductor substrate 2 with well controlled dimensional precision.

Figure 7:
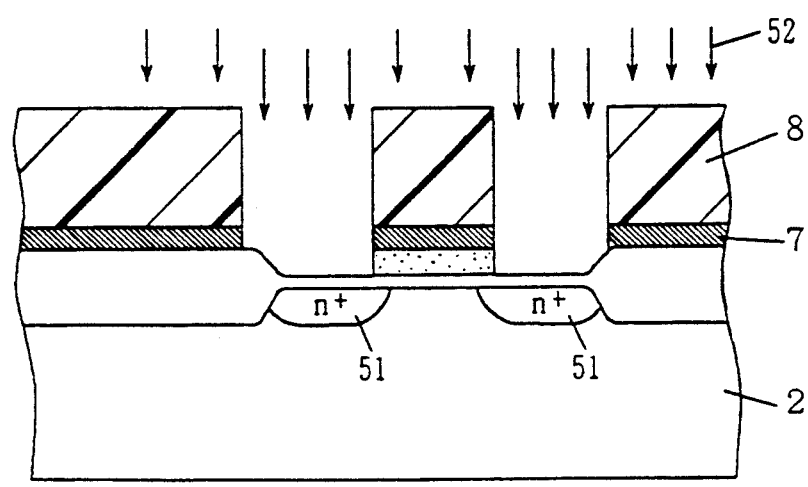
FIG. 7 is a partial cross-sectional view of a semiconductor device showing a method of manufacturing the same according to a third embodiment of the present invention.
Figure 8A:
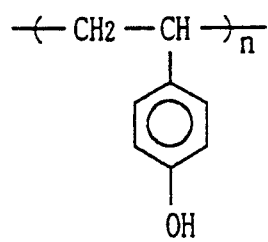
FIGS. 8(a) to 8(c) are chemical structure formulas showing main components of a chemical amplification negative type resist used in a conventional method or in the present invention.
Figure 8B:
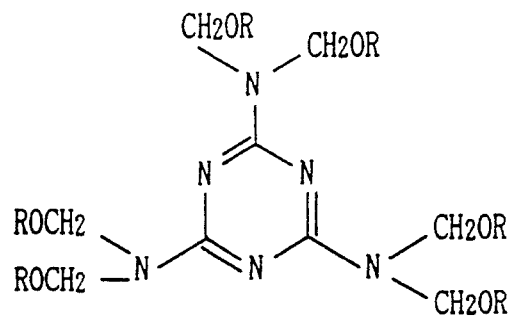
Figure 8C:
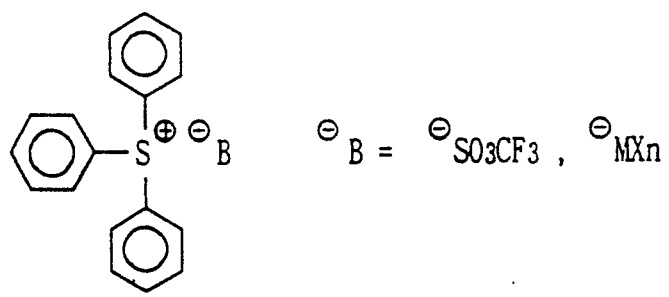
Figure 9A:
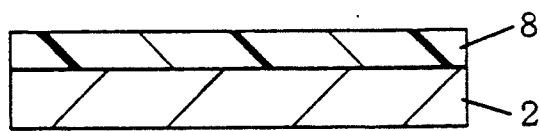
FIGS. 9(a) to 9(d) are partial cross-sectional views of a semiconductor device showing the steps in order of manufacturing a conventional semiconductor device using the chemical amplification negative type resist.
Figure 9B:
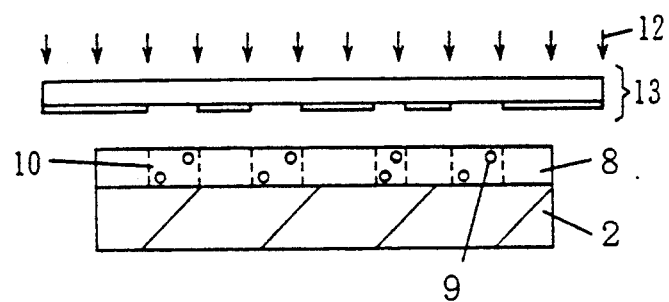
Figure 9C:
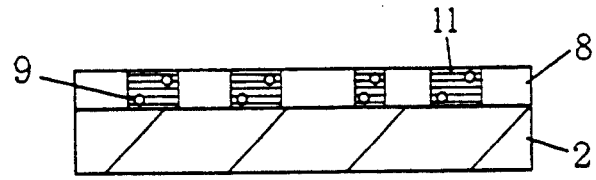
Figure 9D:
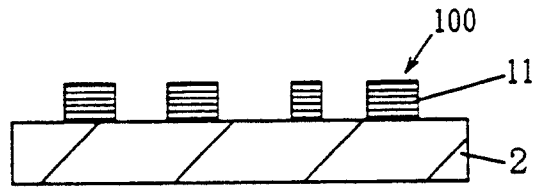
Figure 12A:
FIGS. 12(a) to 12(c) are reaction formulas showing the state of crosslinking in the exposed portion of the chemical amplification negative type resist.
Figure 12B:
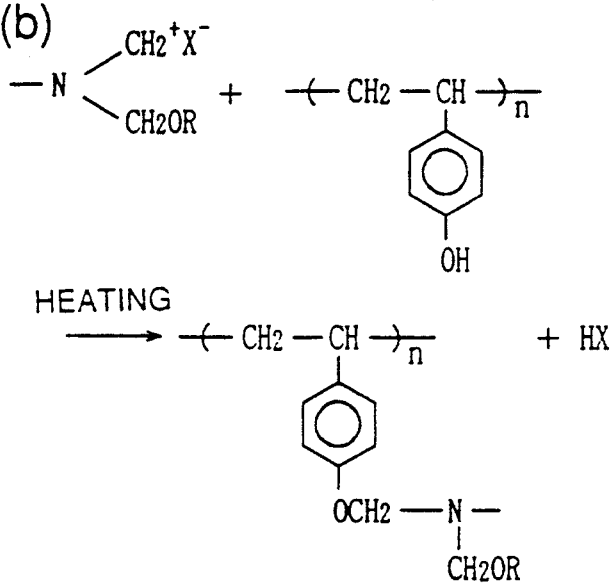
Figure 12C:
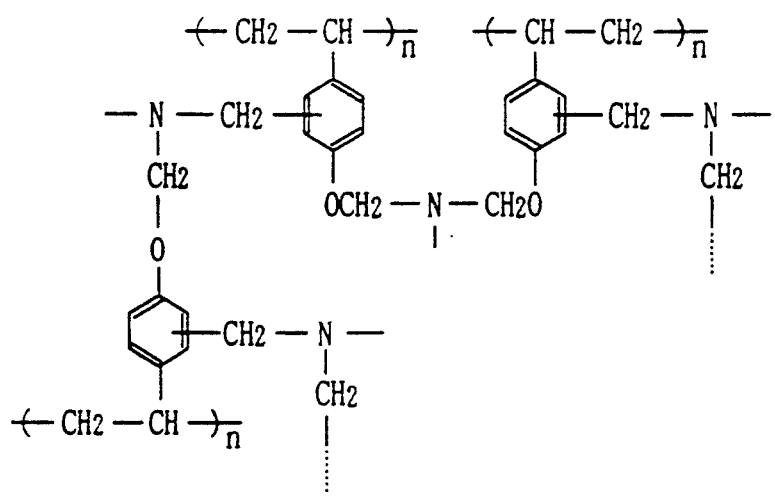
Figure 13:
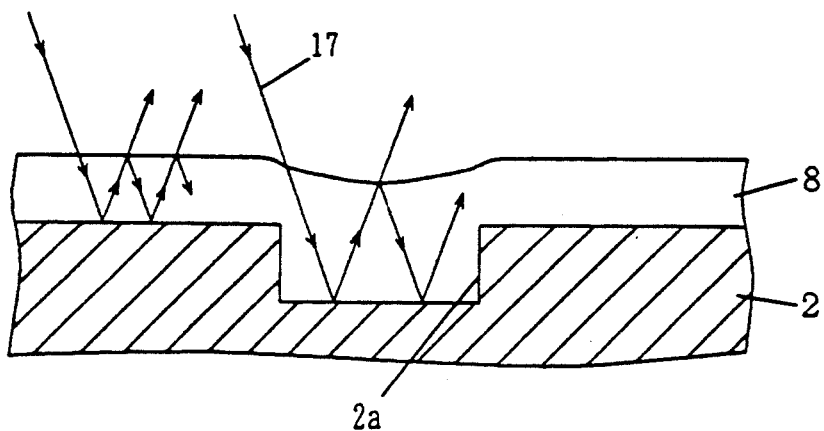
FIG. 13 is a diagram for explaining effects of multiple reflection in film.
Figure 14:
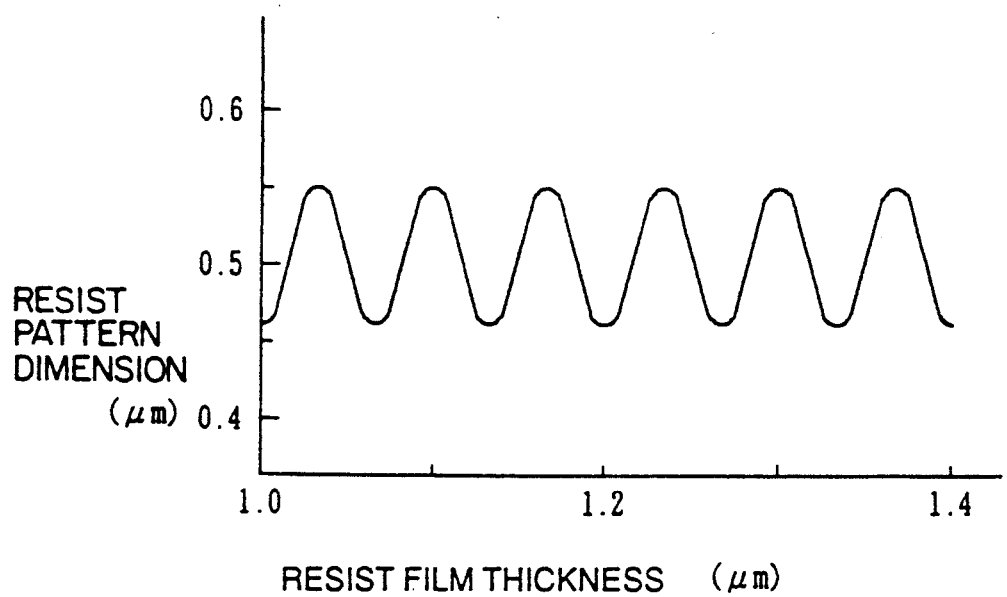
FIG. 14 is a representation showing a relation between the dimension of the resist pattern and the film thickness of the resist when marked effects of multiple reflection in film exist.
Figure 15A:
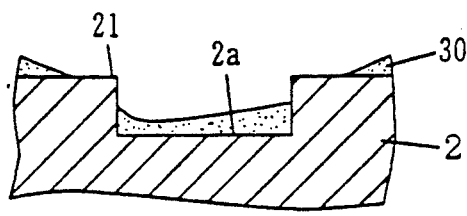
FIGS. 15(a) to 15(e) are partial cross-sectional views of a semiconductor device showing the steps in order of manufacturing the conventional semiconductor device including the step of forming an antireflective film.
Figure 15B:
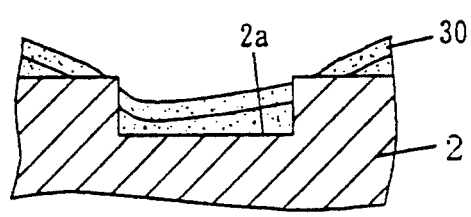
Figure 15C:
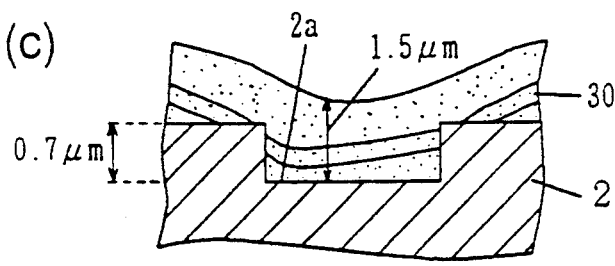
Figure 15D:
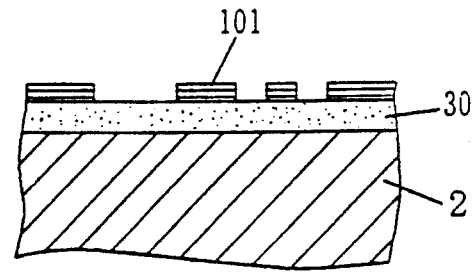
Figure 15E:
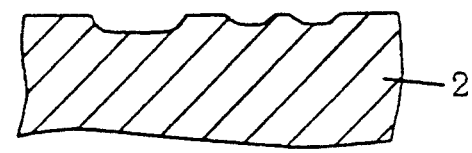
Figure 16A:
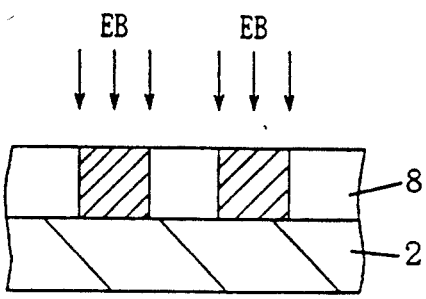
FIGS. 16(a) to 16(c) are partial cross-sectional views of a semiconductor device showing the steps in order of manufacturing the conventional semiconductor device using a method of an electron beam lithography.
Figure 16B:
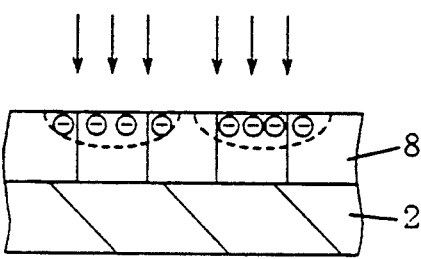
Figure 16C:
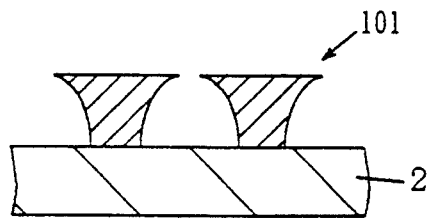
Figure 17:
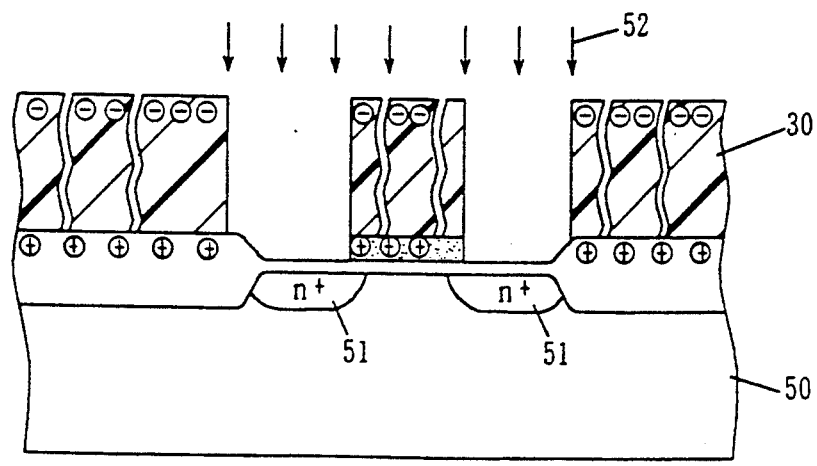
FIG. 17 shows a conventional method of implanting impurity ions in the main surface of the semiconductor substrate using the resist pattern.

FIG. 7 shows a method of manufacturing a semiconductor device according to a third embodiment of the present invention. A pattern of the resist 8 is provided on the semiconductor substrate with the underlying film 7 having conductivity applied interposed therebetween. The underlying film 7 is formed by doping the oxidizing gas to conjugated macrocyclic organic substances. In order to form a source/drain region 51, N type impurity ions 52 are implanted in the main surface of the semiconductor substrate 2. At this time, even though the N type impurity ions are implanted in the surface of the resist 8, the resulting electrical charge escapes to the ground through the underlying film 7 having conductivity applied. As a result, a crack of the resist 8 caused by charging thereof does not take place, which in turn makes it possible to implant the ions 52 precisely.

Although the case where a negative type resist is used as a resist was described in the above embodiments, the present invention is not limited thereto. A positive type resist could take the same effect as that of the embodiments described above.

As described above, in the method of manufacturing semiconductor devices according to one aspect of the present invention, an underlying film of organic substances having strong photoabsorption is formed on the semiconductor substrate. Therefore, light reflected from the semiconductor substrate is reduced, which in turn can suppress variation of the dimension of the resist pattern caused by effect of multiple reflection in film.

As a result, etching of the semiconductor substrate can be carried out with well controlled dimensional precision.

In the method of manufacturing semiconductor devices according to another aspect of the present invention, the underlying film having conductivity applied is formed on the semiconductor substrate prior to resist coating. Therefore, when patterning is effected on resist with an electron beam, the resist is not charged. As a result, resist of a desired shape can be reliably obtained, and it is possible to carry out etching of the semiconductor substrate by using the resist as a mask with well controlled dimensional precision.

In the method of manufacturing semiconductor devices according to still another aspect of the present invention, the underlying film having conductivity applied is formed on the semiconductor substrate with a resist pattern interposed therebetween. Therefore, even if impurity ions are implanted in the main surface of the semiconductor substrate with the resist pattern used as a mask, the resist is not charged. As a result, implantation of the impurity ions can be carried out precisely.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
    forming an underlying film of an organic substance having the properties of sublimation, photo absorption, and insolubility in an organic solvent on a semiconductor substrate;
    applying resist on said underlying film;
    selectively irradiating light to said resist;
    developing said resist for forming a resist pattern; and
    etching said semiconductor substrate with said resist pattern used as a mask.

2. The method of claim 1, wherein
said step of etching said semiconductor substrate is carried out for forming a gate electrode.

3. The method of claim 1, wherein
the thickness of said underlying film is 500 to 2000 Å.

4. The method of claim 1, wherein
said organic substance includes a conjugated macrocyclic organic substance selected from the group consisting of a non-metal phthalocyanine derivative, porphyrin derivatives and dihydro-dibenzo tetraaza-cyclotetradecyne derivatives.

5. A method of manufacturing a semiconductor device, comprising the steps of:
    forming an underlying film of an organic substance having the properties of sublimation and insolubility in an organic solvent on a semiconductor substrate;
    doping an oxidizing gas in said underlying film for applying conductivity to said underlying film;
    applying resist onto said underlying film;
    effecting patterning on said resist with an electron beam;
    developing said resist for forming a resist pattern; and
    etching said semiconductor substrate with said resist pattern used as a mask.

6. The method of claim 5, wherein
said organic substance includes a conjugated macrocyclic organic substance selected from the group consisting of a non-metal phthalocyanine derivative, porphyrin derivatives and dihydro-dibenzo tetraaza-cyclotetradecyne derivatives.

7. The method of claim 5, wherein
said oxidizing gas is added by 0.1 ppm to 100,000 ppm.

8. The method of claim 5, wherein
said oxidizing gas is gas selected from the group consisting of $NO_x$, hydrogen halogenide, halogen gas and $SO_x$.

9. The method of claim 5, wherein
the thickness of said underlying film is 500 to 2000 Å.

10. A method of manufacturing a semiconductor device, comprising the steps of:
    forming an underlying film of an organic substance having the properties of sublimation and insolubility in an organic solvent on a semiconductor substrate;
    doping an oxidizing gas in said underlying film for applying conductivity to said underlying film;
    applying resist onto said underlying film;
    patterning said resist; and
    implanting impurity ions in said semiconductor substrate with said patterned resist used as a mask.

11. The method of claim 10, wherein
said step of implanting said impurity ions is carried out for forming a conductive region in said semiconductor substrate.

12. The method of claim 10, wherein
said organic substance includes a conjugated macrocyclic organic substance selected from the group consisting of a non-metal phthalocyanine derivative, porphyrin derivatives and dihydro-dibenzo tetraaza-cyclotetradecyne derivatives.

13. The method of claim 10, wherein
said oxidizing gas is gas selected from the group consisting of $NO_x$, hydrogen halogenide, halogen gas and $SO_x$.

14. The method of claim 10, wherein
said oxidizing gas is added by 0.1 ppm to 100,000 ppm.

15. The method of claim 10, wherein
the thickness of said underlying film is 500 to 2000 Å.

* * * * *